United States Patent [19]

Shanks

[11] 4,203,123
[45] May 13, 1980

[54] THIN FILM MEMORY DEVICE EMPLOYING AMORPHOUS SEMICONDUCTOR MATERIALS

[75] Inventor: Roy R. Shanks, San Diego, Calif.

[73] Assignee: Burroughs Corporation, Detroit, Mich.

[21] Appl. No.: 859,580

[22] Filed: Dec. 12, 1977

[51] Int. Cl.$^2$ ............................................. H01L 27/24
[52] U.S. Cl. ......................................... 357/2; 357/45; 357/15; 365/163
[58] Field of Search ............................... 357/1, 2, 4, 45

[56] References Cited

U.S. PATENT DOCUMENTS

| | | | |
|---|---|---|---|
| 3,470,426 | 9/1969 | Feldman | 357/2 |
| 3,629,863 | 12/1971 | Neale | 357/2 |
| 3,864,715 | 2/1975 | Mastrangelo | 357/1 |
| 3,886,577 | 5/1975 | Buckley | 357/2 |
| 4,069,492 | 1/1978 | Pankove et al. | 357/2 |

OTHER PUBLICATIONS

Cole, IBM Tech. Discl. Bulletin, vol. 12, No. 10, Mar. 1970, p. 1562.

Cole et al., IBM Tech. Discl. Bulletin, vol. 15, No. 6, Nov. 1971, pp. 2015-2016.

Primary Examiner—William D. Larkins
Attorney, Agent, or Firm—Mervyn L. Young; Kevin R. Peterson

[57] ABSTRACT

This disclosure relates to a thin film amorphous memory cell which can be fabricated upon the surface of a semiconductor substrate in such a manner as to minimize the surface area requirements for each cell thereby increase the packing density of the memory array. Furthermore, since the cell can be fabricated on top of the semiconductor substrate, other active devices can be fabricated in the substrate so as to further increase the packing density of the integrated circuit chip containing memory array or other circuits.

The memory cell is formed of a thin film diode of one or more amorphous semiconductor layers that are doped to form either a PN junction diode or, with one such layer, a Schottky diode, and the memory cell includes an amorphous layer of a tellurium based chalcogenide material that may be employed in either a memory mode or a threshold mode so that the memory cell may be operated in either a non-volatile or volatile manner.

3 Claims, 11 Drawing Figures

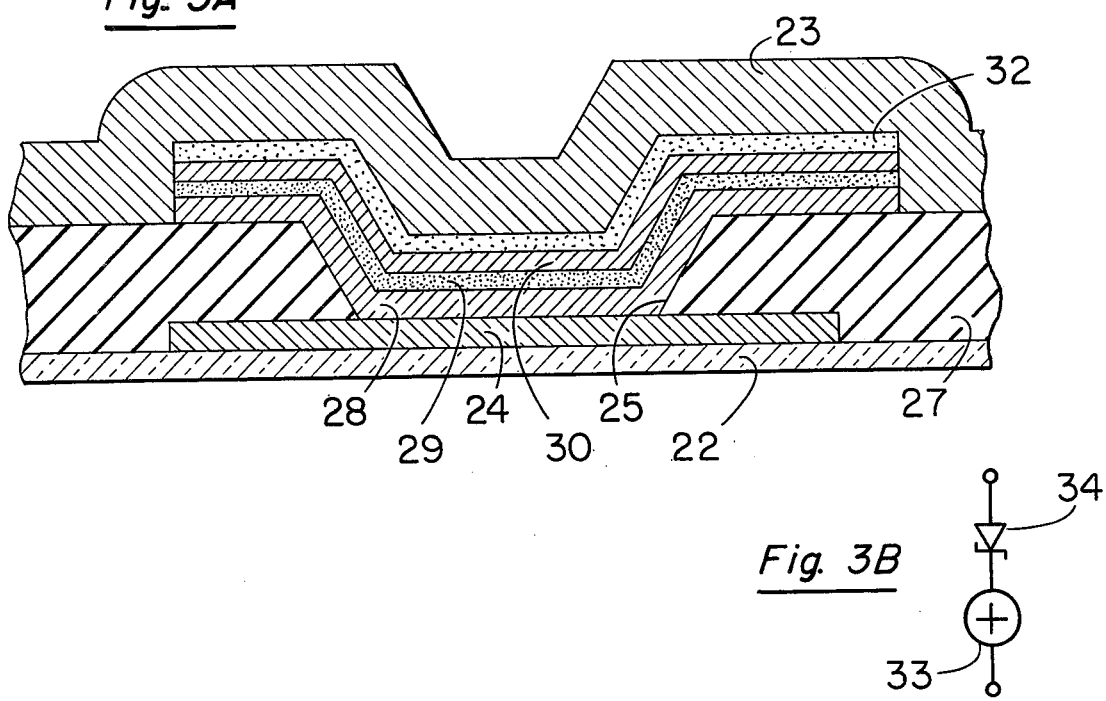
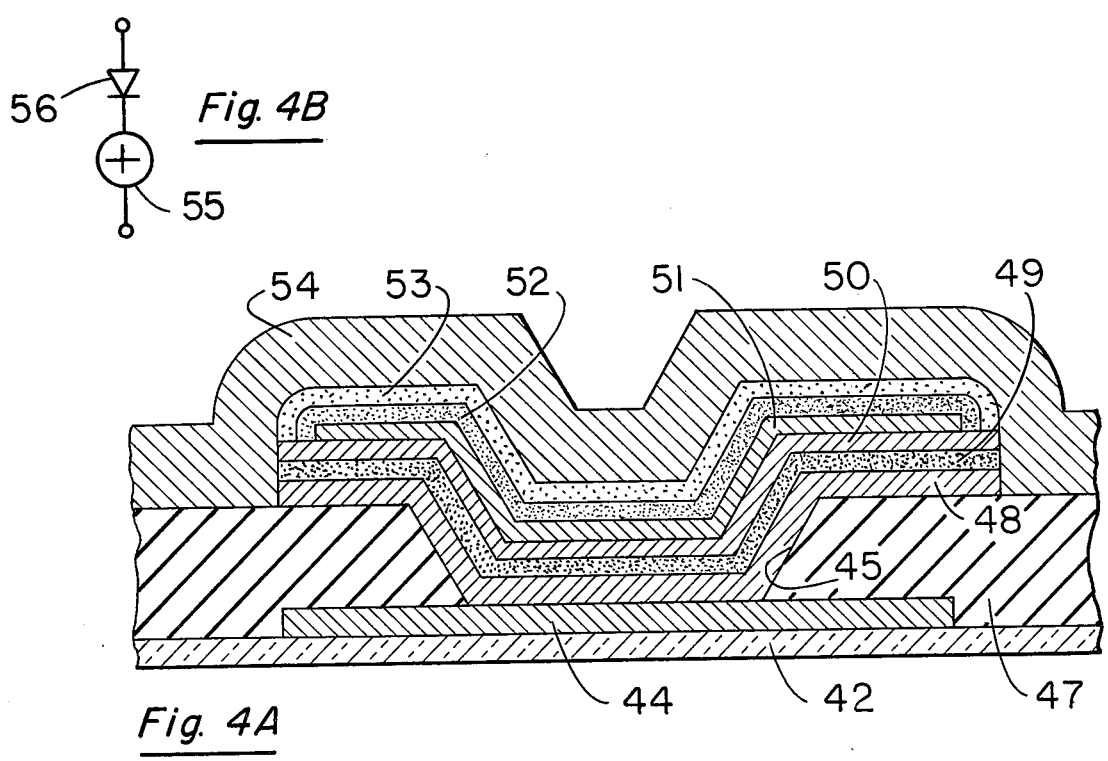

THIN FILM MEMORY DEVICE EMPLOYING AMORPHOUS SEMICONDUCTOR MATERIALS

BACKGROUND OF THE INVENTION

1. Field of the Invention

This invention relates to a thin film amorphous semiconductor memory device and more particularly to such a device that can be formed upon the surface of a substrate.

2. Description of the Prior Art

Both volatile and non-volatile memories can be formed from an amorphous semiconductor devices which are capable of being switched to and from a low-resistance crystalline state. A particular type of memory switching amorphous semiconductor material is the tellurium based chalcogenide class of materials which have the general formula $Ge_A Te_B X_C Y_D$. Such amorphous high-resistance materials can be placed between a pair of spaced apart electrodes. By applying a voltage pulse (between the electrodes) of greater amplitude than the threshold voltage of the amorphous material, a low-resistance film is formed between the electrodes. In the non-volatile mode, the application of this pulse for a proper duration causes a conducting crystalline filament to form and then remain between the electrodes after the pulse is removed (a set operation). A reset group of pulses of appropriate current and duration causes the crystalline path to return to the relatively amorphous state (reset operation). In a volatile mode, with the application of a limited current, the material will switch from the high-resistance to low-resistance state but the crystalline filament will not be formed. Particular materials that may be employed are disclosed in the Ovshinsky U.S. Pat. No. 3,271,591; the Dewald, et al, U.S. Pat. No. 3,241,009; the Neale Pat. No. 3,669,543; and the Buckley U.S. Pat. No. 3,886,577.

The above-referenced Dewald, et al, and Ovshinsky patents indicate that such chalcogenides can be employed in two different manners, namely, as either a threshold device or a memory storage element. In the storage element mode, the chalcogenide layer provides as a non-volatile memory. In the threshold mode, the chalcogenide layer serves as a threshold switch.

A particular advantage of such chalcogenide memory cells is that they provide a non-volatile memory even if power is lost. Furthermore, they require less surface area per cell than do semiconductor memory cells that require at least two transistors for a static memory or a transistor and capacitance for a dynamic memory However, they still require an isolating diode which, in the past, has been formed in the semiconductor substrate.

The above-referenced Buckley patent discloses the location of such an amorphous memory device in a memory matrix where the device is formed in series with a P-N junction isolating diode, the latter of which is formed in a semiconductor substrate. However, formation of such device requires epitaxial, diffusion and other processes which would not be needed if the memory matrix could be formed on top of the substrate. Conversely, by the formation of the memory matrix on top of a silicon substrate, other active devices and circuits can be first formed in the substrate under the cell.

It is then an object of the present invention to provide an improved amorphous semiconductor memory device.

It is another object of the present invention to provide an improved amorphous semiconductor memory device which is employed in the memory matrix that can be formed on the top of the surface of a substrate.

It is still a further object of the present invention to provide an amorphous semiconductor memory matrix which can be formed on top of a substrate having other active elements formed therein.

SUMMARY

In order to achieve the above described objects, the present invention resides in a thin film memory cell that can be fabricated on top of the semiconductor substrate so that other active devices can be fabricated in the substrate so as to further increase the packing density of the integrated circuit chip containing a memory array or other circuits.

The memory cell is formed of a thin film diode of one or more amorphous semiconductor layers that are doped to form either a PN junction diode or, with one such layer and a metal layer, a Schottky diode, and the memory cell includes an amorphous layer of a tellurium based chalcogenide material that may be employed in either a memory mode or a threshold mode so that the memory cell may be operated in either a non-volatile or volatile manner.

A feature, then of the present invention resides in a memory cell formed of a thin film diode of one or more amorphous semiconductor layers that are doped to form either a PN junction diode or a Schottky diode and the memory cell includes an amorphous layer of a tellurium based chalcogenide material.

BRIEF DESCRIPTION OF THE DRAWINGS

The above and other objects, advantages and features of the present invention will become more readily apparent from a review of the following specification when taken in conjunction with the drawings wherein:

FIG. 3A is a cross-sectional view representing one embodiment of the present invention;

FIG. 3B is a schematic diagram representing the embodiment of the present invention as illustrated in FIG. 3A;

FIG. 4A is a cross-sectional view of another embodiment of the present invention;

FIG. 4B is a schematic representation of the embodiment of FIG. 4A;

GENERAL DESCRIPTION OF THE INVENTION

As was indicated above, the present invention employs an amorphous semiconductor material which is of the tellurium based chalcogenide class of materials: $Ge_A Te_B X_C Y_D$. The X constituent may be antimony, bismuth, arsenic, or others, while the Y constituent may be sulfur or selenium. A preferred embodiment of a material to be employed is $Ge_{15}Te_{81}Sb_2S_2$. $Ge_{24}Te_{72}Sb_2S_2$ may be employed in another embodiment.

Figure 1:
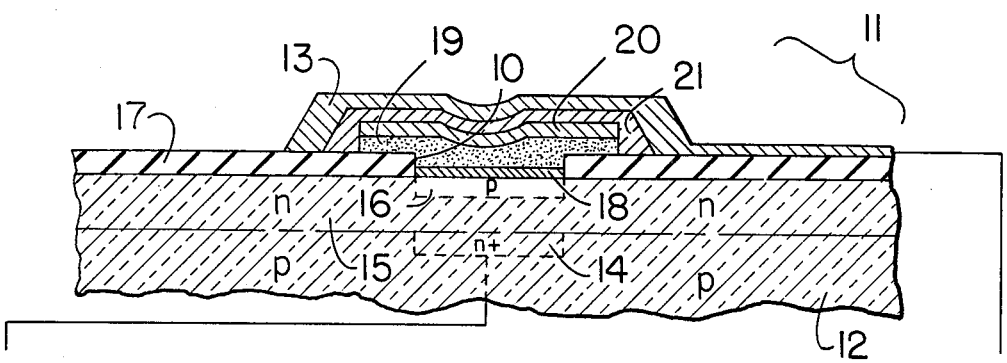
FIG. 1 is a cross-sectional representation of a prior art device.

An embodiment of a prior art memory device which uses such a material is illustrated in FIG. 1. As shown therein, the entire memory device 11 is formed as an integral part of a silicon substrate 12. Device 11 would normally be employed in an array having vertical and horizontal conductors for the random access thereof. In FIG. 1, one of these conductors is the N+ region 14 in substrate 12 which forms a part of a rectifier made up by region 14, N region 15 and P region 16. This rectifier along with memory device 11 form the cross-over point between the orthagonal conductors 13 and 14 where conductor 13 is the positive electrode.

Silicon chip 12 is provided with an insulating material 17 which may be silicon dioxide and in turn is provided with a plurality of openings 10 to initially expose the semiconductor material at those points where the respective memory devices 11 are to be located. An electrically conductive layer 18 is selectively deposited over the exposed portions of the silicon chip. The amorphous chalcogenide memory material 19 is then deposited by appropriate techniques over opening 10. To complete the memory device, crystalline tellurium layer 20 is sputter deposited over the memory material and a barrier-forming refractory metal layer 21 is deposited over that before the electrically conductive metal layer 13 is formed. As disclosed in the above-reference Buckley patent, the material of layer 20 is purposely chosen to be tellurium so as to offset the tellurium migration towards the positive electrode during the set and reset cycles. The material of layer 21 is chosen to be a barrier to the migration of the material of layer 13 (e.g., Al).

Particular methods for suppressing migration effects are disclosed in the Bluhm application, U.S. Ser. No. 801,773, filed May 31, 1977 U.S. Pat. No. 4,115,872; and the Holmberg application, U.S. Ser. No. 847,068, filed Oct. 31, 1977. As taught by the Bluhm and Holmberg applications, a layered structure of different chalcogenide materials is provided to approximate the memory structure that would be formed after many set and reset operations due to migration and diffusion of different constituents of the material. Furthermore, such migration and diffusion causes an unwanted decline in the threshold voltage of the device over its lifetime.

Figure 2A:
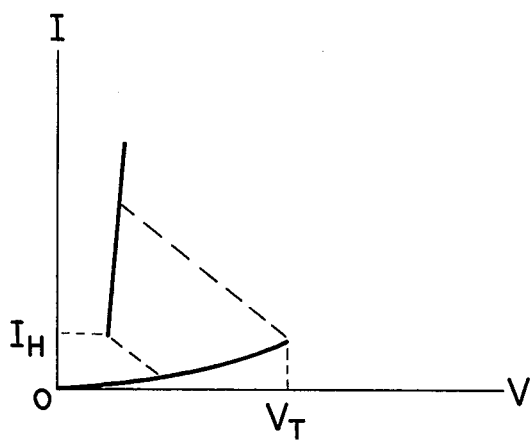
FIGS. 2A and 2B are graphs representing the voltage-current characteristics of an amorphous device for the respective threshold and memory modes of operation.

The voltage-current characteristic of the amorphous device employed in the threshold mode of the present invention is illustrated in FIG. 2A. As shown therein, the device is characterized by high resistance up to a given threshold voltage level $V_T$ whereupon the device then switches to a low-resistance, high conductivity device until the current decreases to a critical hold in value $I_H$ through the device, in which case it will return to a high-resistance state.

Figure 2B:
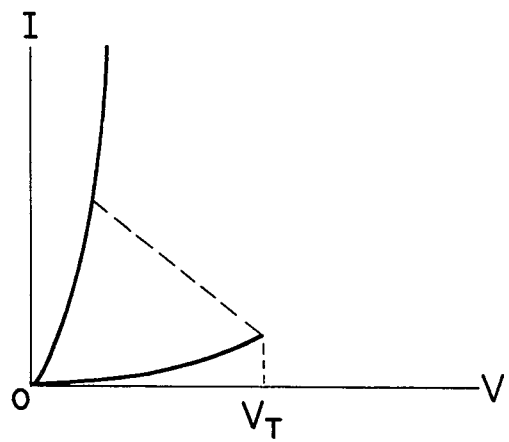

The voltage-current characteristics of an amorphous device employed in the memory mode of the present invention is illustrated in FIG. 2B. As shown therein, the device is characterized by high resistance up to a given threshold level $V_T$ whereupon the device then switches to a low-resistance, high conductivity state. If the applied current is sustained for a sufficient period of time, a few milliseconds, a crystalline filament forms through the device and remains even though the applied voltage is withdrawn. The device then continues to operate in the low-resistance, high conductivity mode until reset by appropriate reset pulses as described above. (For further discussion of these two modes, see Shanks, *Ovonic Threshold Switching Characteristics*, Journal of Non-Crystalline Solids 2 (1970) 504–514).

The present invention is directed toward a memory device employing amorphous chalcogenide materials in both their threshold and memory modes which devices can be formed on top of a substrate as an all-thin film memory cell. To this end, a diode is formed in series with the memory cell between the respective electrodes. The diode may either be a Schottky isolated device or a P-N isolated device. The Schottky diode may be formed by depositing a metal electrode on an amorphous silicon film (see C. R. Wronski, et al, Technical Digest, IEDM 1976, pages 75-78). The P-N diode may be formed in an amorphous semiconductor material such as silicon or germanium by means of a vapor phase deposition technique (see W. R. Spear, P. G. LeComber, Solid State Communications, 17,1193, 1975). As understood by one skilled in the art, Schottky diodes are advantageous when there is a limited amount of voltage due to the slightly lower forward voltage drop of the Schottky diode. Also, P-N diodes tend to store charge and this capacitance causes circuit delays. On the other hand, P-N diodes may have advantages in breakdown voltage on forward characteristics which would result in a higher yield process.

DETAILED DESCRIPTION OF THE PRESENT INVENTION

An embodiment of the present invention is illustrated in FIG. 3A which embodiment employs a Schottky diode as the isolating device for the memory cell. As shown therein, the memory device is formed on a suitable insulated substrate 22 which may be a semiconductor material. Negative conductor 24 is then formed thereon out of a conductive material such as molybdenum. An insulative layer 27 preferably a silicon dioxide is then formed thereover with an opening 25 to receive the memory device. Respective openings 25 mark the cross-over points of the orthagonal conductors which make up the memory array. Layer 28 is then deposited in opening 25 and is of a germanium-tellurium composition with proportions of approximately 25 to 45 percent germanium. Layer 29 is then deposited over the germanium-rich layer and is of a chalcogenide material near its eutectic of approximately 15–17 percent germanium, although this percentage may vary from 10–25 percent. Layer 30 which is a tellurium-rich material is then formed, which layer is approximately 0–10 percent germanium, the rest being tellurium. This layered structure is of the type described in the above Bluhm and Holmberg applications.

In the embodiment of FIG. 3A, the isolating Schottky diode is formed by depositing a layer 32 over tellurium-rich layer 30, layer 32 being of an amorphous silicon or germanium that is slightly doped with N-type dopants and high-conductive conductor 23 is formed thereover to form the Schottky contact with layer 32. Conductor 23 may be formed of aluminum or gold. No barrier layer (such as layer 21 in FIG. 1) is employed as it will form a second Schottky diode with amorphous layer 32.

The schematic diagram for this memory device is illustrated in FIG. 3B where memory device 33 comprises the three tellurium-germanium system layers 28, 29 and 30. Schottky diode 34 comprises the Schottky contact between the lightly doped amorphous silicon or germanium layer 32 and metal contact 23.

Another embodiment of the present invention is illustrated in FIG. 4A which embodiment employs a P-N junction as the isolating diode. As illustrated therein a suitable insulative substrate 42 is provided which may be a semiconductor material. Negative conductor 44 is then formed thereon out of conductive material such as molybdenum. Insulative layer 47 is then formed and via 45 opened therein to receive the memory device. The memory device is formed of layers 48, 49 and 50 in the same manner as were layers 28, 29 and 30 formed in FIG. 3A. Barrier layer 51 is deposited over the memory device. A highly doped N-type amorphous layer 52 is then formed over the barrier layer. Layer 52 is of amorphous silicon or germanium or may be of some other semiconducting material. A highly doped P-type amorphous film 53 is deposited on layer 52 to form the P-N junction diode. High conductive layer 54 is then provided to cover the device, which conductor may be of aluminum or gold, forming an ohmic contact to the P-type amorphous film.

FIG. 4B represents the schematic diagram of the embodiment illustrated in FIG. 4A where the memory device 55 comprises the germanium-tellurium layers 48, 49 and 50 and isolating diode 56 comprises the P-N diode formed by amorphous silicon layers 52 and 53.

Figure 5:
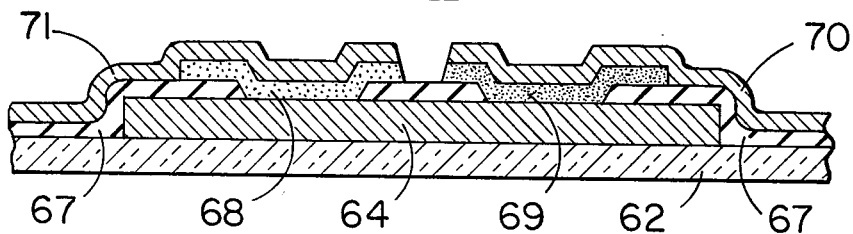
FIGS. 5–7 are cross-sectional views of modified embodiments of the present invention.
Figure 6:
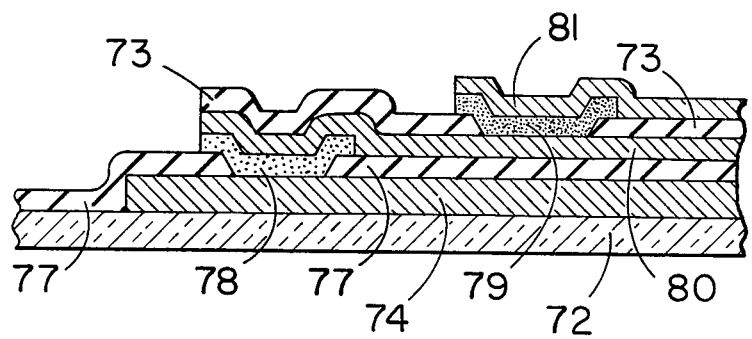
Figure 7:
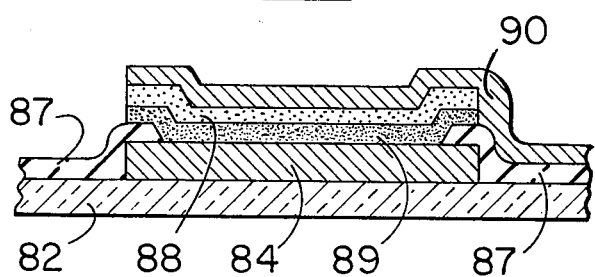

Variations of the above described embodiments are illustrated in FIGS. 5, 6 and 7. In FIG. 5, a respective amorphous memory or threshold device 68 and diode 69 are placed in the same plane on top of a first metal layer 64 which provides electrical connection therebetween. The structure rests on substrate 62. In this case, separate electrical connections 71 and 70 are provided for each of the devices. Appropriate insulating layers 67 are formed during the fabrication process to provide the electrical installation. Another variation is illustrated in FIG. 6 wherein the amorphous device 78 and diode 79 are staggered both horizontally and vertically with electrical connection therebetween being provided by metal layer 80. Connections to the memory array in which the device resides are provided by respective metal layers 81 and 74. The respective metal layers are separated by oxide insulating layers 77 and 73. In the illustrations of FIGS. 5 and 6, detailed structures of the amorphous device and the diode have not been illustrated but may be the same as in the embodiments of FIGS. 3A and 4A.

Figure 8:
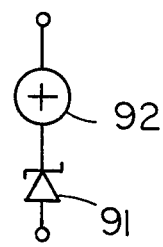
FIG. 8 is a schematic representation of the embodiment of FIG. 7.

A particular variation that is advantageous is illustrated in FIG. 7. As shown therein, the amorphous semiconductor material 89 which is slightly doped is in contact with metal conducting layer 84 to form the Schottky diode and the amorphous memory or threshold device 88 is deposited in electrical contact thereover. Electrical contact to the array is completed by metal layer 90. As in the other embodiments and variations, the memory device is formed on a substrate 82 with appropriate isolation being provided by isolating layers 87. This variation is easily fabricated and has the electrical schematic as illustrated in FIG. 8 wherein the Schottky diode 91 formed by metal layer 84 and amorphous semiconductor material 89 has a reverse polarity between the positive and negative electrodes as will now be in contact with the negative side of memory device 92 as embodied in the memory or threshold layers 88. Again, the structured layer of the memory or threshold device has not been illustrated but will be so arranged that the germanium-rich layer is closest to the negative electrode.

EPILOGUE

A thin film amorphous memory cell has been described which can be fabricated upon the surface of a semiconductor substrate in such a manner as to minimize the surface area requirements for each cell thereby increase the packing density of the memory array. Furthermore, since the cell can be fabricated on top of the semiconductor substrate, other active devices can be fabricated in the substrate so as to further increase the packing density of the integrated circuit chip containing memory array or other circuits.

The memory cell is formed of a thin film diode that may be either a Schottky diode of a P-N junction diode and the memory cell includes an amorphous layer of a tellurium based chalcogenide material that may be employed in either a memory mode or a threshold mode so that the memory cell may be operated in either a non-volatile or volatile manner.

While but a few embodiments of the present invention have been disclosed, it will be apparent to those skilled in the art that variations and modifications may be made therein without departing from the spirit and the scope of the invention as claimed.

What is claimed is:

1. A thin film memory device on a substrate, comprising:
    a plurality of first conductive layers forming a plurality of parallel first conductors;
    a plurality of second conductive layers forming a plurality of parallel second conductors perpendicular to said first conductors;
    each of said first conductive layers serving as a first electrode;
    a plurality of structures of memory material mounted in electrical contact with said first electrode at the intersection of each of said first and second conductors, which structures have first, second, and third regions;
    said second regions being formed of a tellurium germanium based chalcogenide which has a higher electrical resistance in its amorphous state and a lower electrical resistance in its crystalline state and can be switched from one state to the other upon application of an electrical signal of appropriate value;
    said first regions being formed of a material having a higher percentage of tellurium than said second regions;
    said third regions being formed of a material having a higher percentage of germanium than said second regions;
    said third regions being in direct electrical contact with said first conductive layers; said second regions being in contact with said third regions, said first regions being in contact with said second regions;
    a plurality of layers of N-type amorphous semiconductor material, each layer being in direct electrical contact with a corresponding first region of a corresponding one of said structures of memory material,
    a layer of material in rectifying contact with each layer of N-type amorphous semiconductor material, each of said second conductive layers serving as a second electrode in direct electrical contact with said layers of material in rectifying contact with said layers of N-type amorphous semiconductor material.

2. The memory array of claim 1, wherein said layer of material in rectifying contact with each layer of N-type amorphous semiconductor material is a layer of P-type amorphous semiconductor material.

3. The memory array of claim 1, wherein said layer of material in rectifying contact with each layer of N-type amorphous semiconductor material is a portion of the corresponding second conductive layer serving as a second electrode, said second conductive layers being composed of a metal forming a rectifying Schottky barrier with said layers of N-type amorphous semiconductor material.

* * * * *